US006129564A

United States Patent [19]

Kawamae et al.

[11] Patent Number: 6,129,564

[45] Date of Patent: Oct. 10, 2000

[54] CARD CONNECTOR

[75] Inventors: Takahiro Kawamae; Hiroyuki Obata, both of Kanagawa, Japan

[73] Assignee: The Whitaker Corporation, Wilmington, Del.

[21] Appl. No.: 09/362,152

[22] Filed: Jul. 28, 1999

[51] Int. Cl.[7] ........................ H01R 12/00; H01R 13/648; H01R 4/66; H01R 13/60; H05K 1/00

[52] U.S. Cl. .............................. 439/101; 439/79; 439/95; 439/541.5

[58] Field of Search ................................ 439/94, 95, 108, 439/59, 62, 76.1, 79, 660, 607, 80, 541.5, 101

[56] References Cited

U.S. PATENT DOCUMENTS 5,364,275 11/1994 Ota et al. .................................. 439/65
5,688,130 11/1997 Huang ....................................... 439/79
5,775,923 7/1998 Tomioka ................................... 439/79

FOREIGN PATENT DOCUMENTS 8-241764 9/1996 Japan .

*Primary Examiner*—Paula Bradley
*Assistant Examiner*—Edwin A. León

[57] ABSTRACT

The present invention provides a card connector with a low height which makes it possible to make highly-reliable electrical connections with cards in which signal contacts are disposed on a surface of the card. The card connector (10) has grounding contacts (60) and electrical contacts (50), which are used to electrically connect with ground contacts and signal contacts disposed on one surface of the card accommodated in the card connector. The grounding contacts (60) and electrical contacts (50) are disposed side-by-side on the same side of the card connector.

6 Claims, 3 Drawing Sheets

CARD CONNECTOR

FIELD OF THE INVENTION

The present invention relates to a card connector to accommodate cards and to be electrically connected thereto; more specifically, the present invention relates to a card connector which includes grounding contacts that are electrically connected to ground contacts disposed on one side of each of the cards.

BACKGROUND OF THE INVENTION

A conventional card connector disclosed in Japanese Patent Application No. 8-241764 is equipped with a dielectric housing, which accommodates cards at an inside end of a frame that guides the cards. In addition to electrical contacts that make electrical connections with respective electrical contacts disposed at end portions of the cards, the housing is equipped with grounding contacts that make electrical connections with ground contacts disposed on one surface of each of the accommodated cards.

In recent years, cards for use in special applications have been proposed which have the same shape and dimensions as conventional cards, but which have signal contacts disposed in positions other than the end portions (e.g., positions located on the main surfaces). An object of the present invention is to provide a card connector which, while maintaining a construction that allows good electrical connections to be made with ordinary cards, also allows highly reliable electrical connections to be made with special cards.

SUMMARY OF THE INVENTION

The present invention is a card connector, which has a housing that accommodates cards, first electrical contacts, which are electrically connected with electrical contacts of cards when the cards having electrical contacts on end portions are accommodated in the housing, and grounding contacts, which are electrically connected with ground contacts positioned on one surface of each of the cards, second electrical contacts, which are electrically connected to signal contacts disposed on the surface of each of the cards when the cards are accommodated in the housing, are disposed alongside the grounding contacts on the same side as the grounding contacts.

The grounding contacts comprise a plurality of electrical contacts that are separated from each other, and the second electrical contacts are disposed between the plurality of electrical contacts constituting the grounding contacts.

The grounding contacts and the second electrical contacts are formed from metal sheets, and the contact sections thereof are positioned so that they are coplanar.

The grounding contacts and second electrical contacts are respectively fastened in place by being press-fitted in first and second passages or grooves located in a wall of the housing.

Grounding contacts and second electrical contacts have press-fitting shoulders that are aligned in a specified mutual relationship, and both the grounding contacts and second electrical contacts are press-fitted in the housing at the same time.

The respective contact sections of the grounding contacts and second electrical contacts form rows in different positions with respect to the direction of accommodation of the cards in the housing.

The first electrical contacts, the grounding contacts and the second electrical contacts are connected to other circuit boards via a single multi-layer circuit board that is positioned at an inner end of the card connector.

BRIEF DESCRIPTION OF THE DRAWINGS

An embodiment of the present invention will now be described by way of example with reference to the accompanying drawings in which:

FIG. 1 shows an overall configuration of a card connector of the present invention.

FIG. 2 shows electrical contacts of the card connector shown in FIG. 1.

DETAILED DESCRIPTION OF THE INVENTION

Figure 1A:
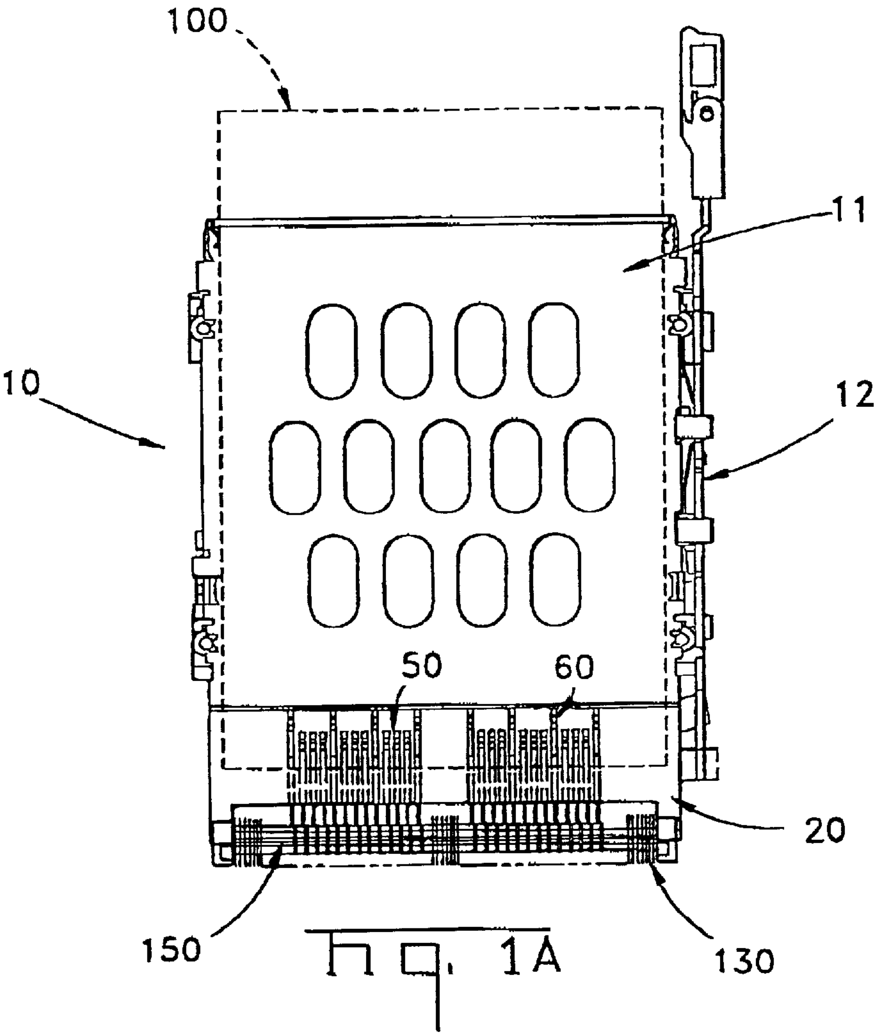
FIG. 1*a* is a top plan view of the card connector.
Figure 1B:
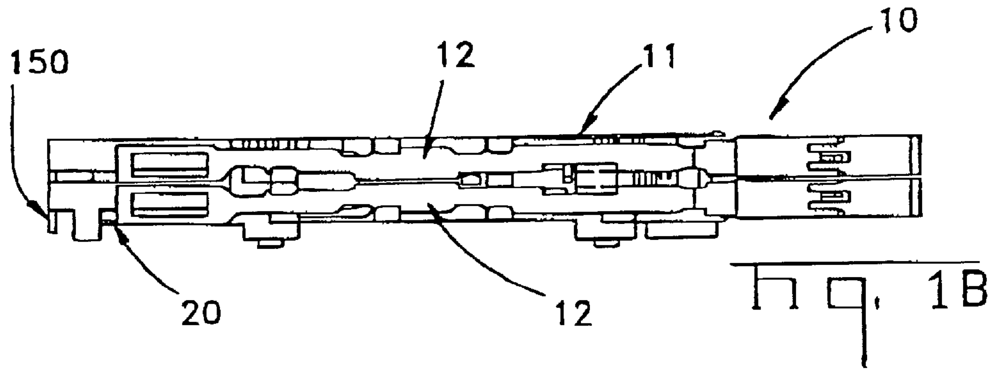
FIG. 1*b* is a side view thereof.

Card connector 10 of the present invention accommodates cards (especially PC cards based on PCMCIA standards) 100, and makes electrical connections with the cards. In FIG. 1, the card connector 10 has an electrical connector 20, which accommodates ends of cards 100, a guide frame 11, which guides the cards 100 toward the electrical connector 20, and a card-ejection mechanisms 12, which are mounted along one side of the guide frame 11. A plurality of electrical contacts 50, 60 are mounted in the electrical connector 20. The cards 100 inserted into the guide frame 11 reach the electrical connector 20 as a result of being guided by the guide frame 11, and electrical contacts positioned at the end of each card 100 electrically engage with the electrical contacts 40 inside the connector 20. The electrical contacts can be connected via a circuit board 150 installed on an outer side of the electrical connector 20 to another circuit board on which the card connector 10 is mounted. In particular, in FIG. 1*a,* an electrical connector 130, which is used for connection with the circuit board 150 and which can be mounted on another circuit board, is also shown.

The card connector 10 is equipped with additional electrical contacts (second contacts) 50 for electrical connection to a surface of the card in positions along an upper surface of the card connector. The second contacts 50 are used for electrical connection to additional signal contacts utilizing areas other than the end portions (e.g., one surface) in cards of this type, as recently required. In particular, the card connector 10 of the present invention is constructed such that the additional electrical contacts 50 are disposed side by side with the grounding contacts 60 on one surface of the electrical connector 20. This construction will be described in detail below.

Figure 2A:
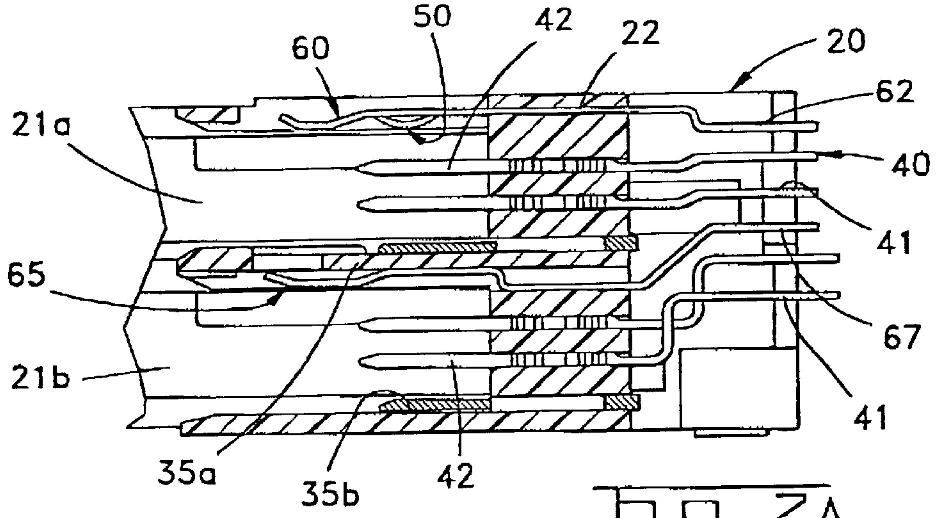
FIG. 2*a* is a longitudinal cross-sectional view.

In FIG. 2*a,* male electrical contacts (first contacts) 40, which can be electrically connected with electrical contacts disposed on the end of an ordinary card, are supported in dielectric housing 22 of the electrical connector 20. The electrical contacts 40 are secured in place by being press-fitted in the housing 22, and contact sections 42, which make electrical contact with inner electrical card contacts of the cards are disposed in two rows inside respective connector sections 21*a,* 21*b* in the housing 22. Furthermore, as will be seen by referring to FIG. 2*b* as well, the contacts 40 include connection sections 41, which make electrical connections with the circuit board 150.

Figure 2B:
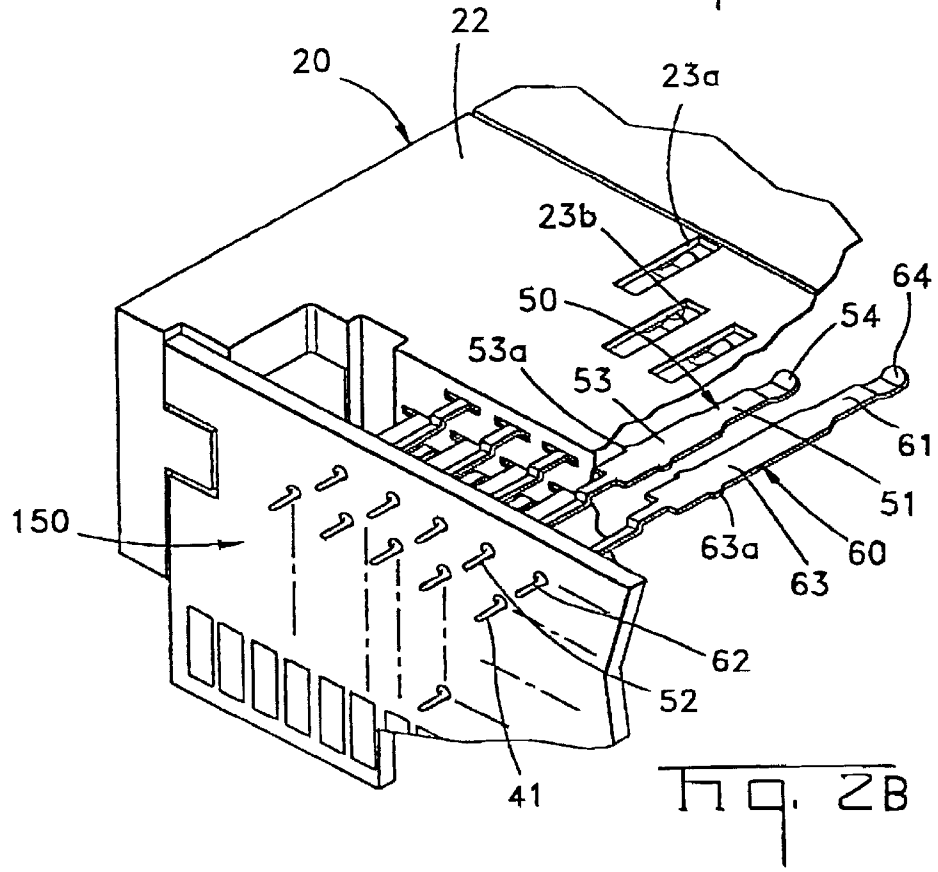
FIG. 2*b* is a part perspective view as seen from a right hand side of FIG. 2*a.*

As is seen from FIGS. 2*a* and 2*b*, of the two connector sections 21*a*, 21*b*, only upper connector section 21*a* contains grounding contacts 60 and electrical contacts 50; only grounding contacts 65 are disposed in lower connector section 21*b*. The grounding contacts 60, 65 form a ground circuit by electrically engaging the ground contacts disposed on the surfaces near the end portions of ordinary cards 100 or special-use cards accommodated in the respective connector sections 21*a*, 21*b*. The shape of the grounding contacts 65 is not shown; however, the grounding contacts 65 can be manufactured by stamping and forming a single metal sheet in the direction of width of the electrical connector 22. The electrical contacts 40, the grounding contacts 60, electrical contacts 50 and grounding contacts 65 include connection sections 62, 52 and 67 to make electrical connections with the circuit board 150 by soldering. Furthermore, metal members 35*a*, 35*b*, which are disposed in positions facing the grounding contacts 60 and electrical contacts 50 and the grounding contacts 65 in the respective connector sections 21*a*, 21*b*, are card-ejection arms as part of card-ejection mechanisms 12, which are installed so that the arms can pivot inside the connector 20 to eject cards.

In particular, as shown in FIG. 2*b*, the grounding contacts 60 and additional electrical contacts 50, which are positioned in the connector section 21*a* along an upper wall of housing 20, are press-fitted in the housing 22 so that the contacts are coplanar. The contacts 60, 50 have respective contact sections 61, 51 which are planar, possess resiliency and which include arcuate contacts 64, 54 that are bent so that the arcuate contacts 64, 54 protrude within connector section 21*a*. The arcuate contacts 64, 54 make stable electrical connection with the ground contacts and signal contacts of special-use cards as a result of the sufficient resilient force of the contact sections 61, 51. As shown in FIG. 2*b*, the contact sections 61, 51 have substantially the same shape and dimensions, and they respectively extend from securing sections 63, 53 that are secured to the housing 22. Furthermore, as shown in FIG. 2*b*, press-fitting projections 63*a*, 53*a* are disposed along side edges of the securing sections 63, 53. Furthermore, openings 23*a*, 23*b* are located in an upper wall of the housing 22 in order to allow sufficient flexing space for the contact sections 61, 51 while at the same time lowering the height of the housing 22.

The grounding contacts 60 and additional electrical contacts 50 are formed by stamping and forming the same metal sheet and they can be press-fitted in the housing 22 at the same time. As a result, the securing of the contacts 60, 50 to the housing 22 can be simplified, so that assembly costs can be lowered. Furthermore, by forming the contact sections 61, 51 with the same shape and dimensions, it is possible to obtain a structural advantage of forming both types of contacts with the same die; moreover, dimensional control and spring structure for electrical contact purposes are facilitated, and the reliability of electrical connections with the grounding contacts and signal contacts (and especially with the latter contacts) of special-use cards can be guaranteed. Moreover, the positions of the arcuate contacts 64 of the contact sections 61 are the same as the positions of the resilient members of the grounding members of the card connector disclosed in Japanese Patent Application No. 8-241764 referred to above. In other words, the card connector 10 of the present invention allows connection with special-use cards, and at the same time maintains favorable characteristics at relatively high frequencies in the case of electrical connection with ordinary cards 100.

Figure 3:
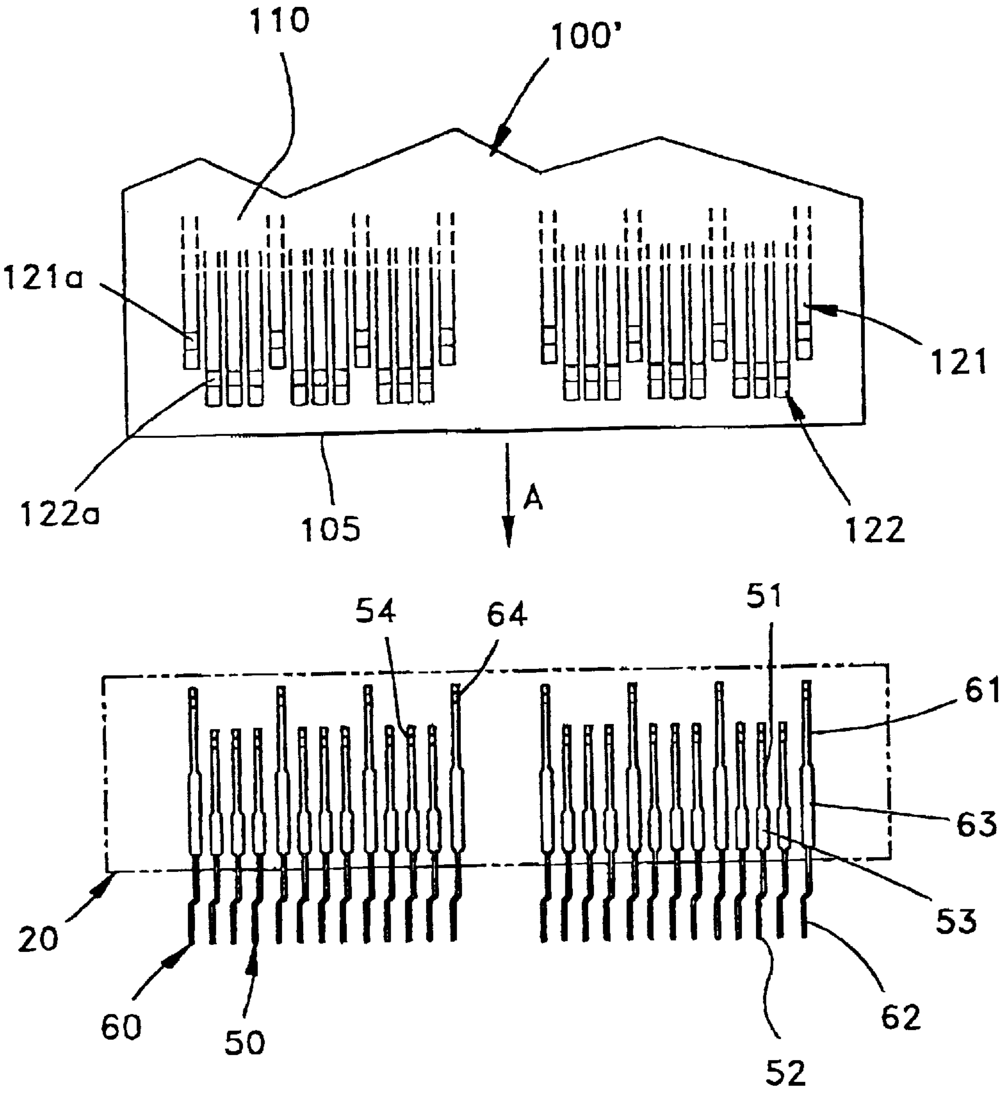
FIG. 3 is a schematic top plan view illustrating the contact action of the grounding contacts and additional contacts when a special-use card is accommodated in the card connector shown in FIG. 1.

FIG. 3 is a schematic plan view which illustrates the contact action of the grounding contacts and additional electrical contacts when a card is accommodated in the electrical connector.

A special-use card 100' that is to be accommodated in the card connector 10 is shown in FIG. 3. Card 100' has the same shape and dimensions as an ordinary card 100, but it also has both ground contacts 121 and signal contacts 122 on one surface 110. The ground contacts 121 and signal contacts 122 respectively include contact projections 121*a*, 122*a* that protrude upward from the surface 110 of the card 100'. The contact projections are disposed in positions that are shifted in the direction of card accommodation; accordingly, when the card 100' is accommodated (see arrow A) in the electrical connector 20, the contact sections 61 first interfere with the end 105 of the card 100', after which the contact sections 51 interfere therewith. Accordingly, the peaks of the insertion force required when the card 100' is accommodated within the electrical connector 20 are shifted so that accommodation of the card 100' can be smoothly performed. When the card 100' is completely accommodated within the electrical connector 20, the contact sections 61, 51 are respectively electrically connected to the contact projections 121*a*, 121*b*. Furthermore, the card 100' does not necessarily include internal electrical contacts for electrical connection with the electrical contacts 40.

A card connector constructed according to a preferred embodiment of the present invention has been described above. However, this embodiment is merely an example; further modifications and alterations may be made by a person skilled in the art. For example, in the present card connector, the grounding contacts 60 and additional electrical contacts 50 were secured to the housing 22 by press-fitting; however, these contacts could also be secured to the housing by insert molding. Furthermore, in the present card connector, the grounding contacts 60 and additional electrical contacts 50 have shapes in which the lengths of the respective securing sections 63, 53 are varied (see FIG. 3); however, it would also be possible to realize a structure in which the peaks of the insertion force are shifted by varying the press-fitting depth, with the lengths of the securing sections being the same.

A card connector of the present invention has second electrical contacts which are electrically connected to signal contacts disposed on one surface of a card and they are disposed side-by-side with grounding contacts on the same side of the card connector. Accordingly, highly-reliable electrical connections with cards in which additional signal contacts are disposed on the surface can be obtained while the basic construction of a conventional card connector is maintained. In particular, the present invention makes it possible to realize such a construction with a low height, so that the present invention is suitable for use in notebook type PC's, in which a low height and small size are required.

What is claimed is:

1. A card connector for electrical connection to PCMCIA compatible cards, comprising a housing having a card-accommodating connector section in which an end of a PCMCIA compatible card is accommodated;

first electrical contacts secured in the housing and having first contact sections for electrical connection with card contacts in the end of the PCMCIA compatible card;

grounding contacts secured in the housing and having ground contact sections extending along an upper wall of the card-accommodating connector section of the housing for electrical connection with ground contacts on a surface of the PCMCIA compatible card; and second ungrounded electrical signal contacts, electrically separate from the grounding contacts, secured in the housing and having second contact sections extending along the upper wall of the card-accommodating connector section of the housing for electrical connection with signal contacts on the surface of the PCMCIA compatible card.

2. A card connector as claimed in claim 1, wherein the grounding contacts and the second electrical contacts are disposed side-by-side.

3. A card connector as claimed in claim 1, wherein the housing has another card-accommodating section in which an end of another card is accommodated, and other grounding contacts are secured in the housing and extend along an upper wall of the other card-accommodating section.

4. A card connector as claimed in claim 1, wherein the ground contact sections and the second contact sections are in a plane.

5. A card connector as claimed in claim 4, wherein the ends of the ground contact sections and the second contact sections have arcuate contacts.

6. A card connector as claimed in claim 5, wherein the upper wall of the card-accommodating section has openings in which the contact sections and the arcuate contacts can flex.

* * * * *